United States Patent [19]

Morikawa et al.

[11] Patent Number: 5,580,847

[45] Date of Patent: Dec. 3, 1996

[54] AQUEOUS AMMONIA COMPOSITION

[75] Inventors: Fumihiro Morikawa; Akihisa Yoshikawa, both of Toyama-ken; Norio Ishikawa, Soka; Takao Shihoya, Tokyo, all of Japan

[73] Assignees: Nissan Chemical Industries, Ltd.; Kanto Kagaku Kabushiki Kaisha, both of Tokyo, Japan

[21] Appl. No.: 472,289

[22] Filed: Jun. 7, 1995

Related U.S. Application Data

[63] Continuation of Ser. No. 26,822, Mar. 5, 1993, abandoned.

[30] Foreign Application Priority Data

Mar. 6, 1992 [JP] Japan .................................. 4-097516

[51] Int. Cl.$^6$ .............................. C11D 3/32; C11D 3/39
[52] U.S. Cl. ...................... 510/175; 510/494; 510/372
[58] Field of Search .................................. 252/545, 156, 252/548, 102, 103

[56] References Cited

U.S. PATENT DOCUMENTS

| | | | |
|---|---|---|---|
| 2,877,267 | 3/1959 | Tiers | 252/545 |
| 2,937,098 | 5/1960 | Geen | 106/10 |
| 3,741,914 | 6/1973 | Parks | 252/545 |
| 3,803,199 | 4/1974 | Voss et al. | 252/545 |
| 3,900,508 | 8/1975 | Voss et al. | 252/545 |
| 3,901,727 | 8/1975 | Loudas | 134/4 |
| 4,014,926 | 3/1977 | Dear et al. | 252/545 |
| 4,299,749 | 11/1981 | McCarthy et al. | 260/29.6 Z |

FOREIGN PATENT DOCUMENTS

| | | |
|---|---|---|
| 0416126 | 3/1991 | European Pat. Off. . |
| 0561236 | 9/1993 | European Pat. Off. . |

OTHER PUBLICATIONS

Patent Abstracts of Japan, vol. 13, No. 195 (May 10, 1989).
Mishima et al, IEEE Transactions on Semiconductor Manufacturing, vol. 2, No. 3, pp. 69–75 (1989). No month available.
van den Meerakker et al, Journal of the Electrochemical Society, vol. 137, No. 4, pp. 1239–1243 (1990). No month available.
IBM Technical Disclosure Bulletin, vol. 26, No. 12, pp. 6456–6457 (1984). No month available.
W. Kern, et al. (1970) RCA Review, pp. 187–207 (*no month available).

*Primary Examiner*—Erin M. Harriman
*Attorney, Agent, or Firm*—Birch, Stewart, Kolasch & Birch, LLP

[57] ABSTRACT

An aqueous ammonia composition having low surface tension is disclosed, which comprises ammonia water and a fluoroalkylsulfonamide compound having the following general formula:

$$R^1SO_2NR^2-X-H \qquad (I)$$

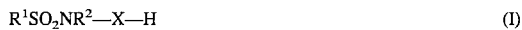

wherein $R^1$ represents a fluoroalkyl group, $R^2$ represents a hydrogen atom or a lower alkyl group, X represents a grouping selected from $CH_2COO$ and $(CH_2CH_2O)_n$, wherein n is a positive integer from 1 to 20. This aqueous ammonia composition may be mixed with an aqueous hydrogen peroxide solution and water so that it can be used for cleaning a semiconductor substrate. The cleaning solution has outstanding stability, and exhibits improved efficacy in removing microparticles of impurities and excellent surface-protecting effect on the semiconductor substrate that is useful in the manufacture of high density integrated circuit elements.

7 Claims, No Drawings

AQUEOUS AMMONIA COMPOSITION

This application is a continuation of application Ser. No. 08/026,822 filed on Mar. 5, 1993, now abandoned.

BACKGROUND OF THE INVENTION

1. Field of the Invention

The present invention relates to an aqueous ammonia composition having low surface tension that is useful, for example, for cleaning substrates in the field of semiconductors. More particularly, the present invention relates to an aqueous ammonia composition having low surface tension, which contains a specific fluoroalkylsulfonamide, and that is suitable as a cleaning agent to be used in the semiconductor industry.

2. Description of the Prior Art

With the development of the electronic industry, various semiconductor elements are designed and manufactured. These semiconductor elements generally use silicon wafers as a substrate. In the process for manufacturing semiconductors, ammonia water is used in combination with other substances for cleaning silicon substrates, especially to remove microparticles therefrom and to eliminate residual matters after resist ashing.

In recent years, the density of integrated circuits has been increased to induce more minute and complicated patterns. The use of conventional ammonia water, which has high surface tension, in such case inevitably gives rise to trouble in cleaning, such that removal of microparticles lodged in gaps between the micropatterns becomes difficult.

RCA-cleaning was reported by W. Kern et al.: RCA Review 31, PP 187–205, June (1970) and has been widely utilized in the semiconductor industry. In the RCA-cleaning, a mixed solution of ammonia water and an aqueous hydrogen peroxide is usually used, the proportion of such mixed solution typically being one part ammonia, one part hydrogen peroxide, 6 parts water in terms of volume ratio.

In cleaning a silicon substrate with the RCA-cleaning solution, however, the following problems have been associated with using the mixed solution:

(1) Particle adhesion (2) Microroughness (3) Metallic adhesion.

As a result, the treated substrate becomes coarse and permits the formation of fine pits, which cause deterioration of the resultant semiconductor element.

Accordingly, it is desirable to develop a new type of aqueous ammonia composition that overcomes drawbacks of the prior art conventional solution, that has a low surface tension, and that produces a remarkably increased cleaning performance without damaging the surface of the substrate.

BRIEF SUMMARY OF THE INVENTION

It is an object of the present invention to provide a new aqueous ammonia composition that overcomes the drawbacks of the conventional ammonia water as a cleaning agent.

It is another object of the present invention to provide a new type of aqueous ammonia composition having low surface tension and improved efficacy in removing microparticles from the micropatterns on the surface of a semiconductor substrate.

It is still another object of the present invention to provide a new type of aqueous ammonia composition which is chemically stable, produces no harmful effect on a semiconductor substrate and, in fact, produces a positive effect of protecting the surface and further ensuring good quality and reliability of the semiconductor elements.

It is a further object of the present invention to provide a cleaning agent for a semiconductor substrate.

It is still further object of the present invention to provide the use of a new type of aqueous ammonia composition to be used in the surface-cleaning treatment of a semiconductor substrate.

Other objects, features and advantages of the present invention will become more fully apparent from the following description.

DETAILED DESCRIPTION OF THE INVENTION

As a result of extensive research by the present inventors to overcome various drawbacks associated with the use of a conventional ammonia water-hydrogen peroxide solution, it has now been found, surprisingly, that a composition containing a specific surfactant of the fluorine series is chemically stable in a mixed solution of ammonia water and aqueous hydrogen peroxide, has a lower surface tension, and has an improved efficacy in removing very fine impurities from the surface of the semiconductor substrate without adversely affecting the substrate. The present invention is based on the above finding.

The present invention provides a new aqueous ammonia composition for use as a cleaning agent for semiconductor substrates, wherein the composition comprises ammonia water and a fluoroalkylsulfonamide compound having the following general formula (I):

$$R^1SO_2NR^2\text{---}X\text{---}H \tag{I}$$

wherein $R^1$ represents a fluoroalkyl group, $R^2$ represents a hydrogen atom or a lower alkyl group, and X represents a grouping selected from $CH_2COO$ and $(CH_2CH_2O)_n$, wherein n is a positive integer from 1 to 20.

The present invention, further, provides a cleaning agent for a semiconductor substrate, wherein the cleaning agent comprises the aqueous ammonia composition in admixture with an aqueous hydrogen peroxide solution and water.

The present invention, furthermore, provides for the use of the aqueous ammonia composition as a cleaning agent for removing very fine impurities from a semiconductor substrate and for protecting the surface of the substrate.

In the composition of the present invention, the fluoroalkylsulfonamide compound of the above general formula (I), which is used as the main ingredient of the composition, is soluble in water, but should not contain any alkali or alkaline earth metal such as sodium, potassium, calcium or the like therein.

The fluoroalkylsulfonamide compound is commercially available as a surfactant of fluorine series, or may be easily be prepared according to known methods.

In connection with the general formula (I), examples of the group $R^1$ include a linear or branched alkyl group having 1–18 carbon atoms, and preferably 1–8 carbon atoms, and having one or more fluorine atoms in the group. An example of the group $R^2$ is an alkyl group having 1–4 carbon atoms, which may be of a straight or branched chain, and is preferably a methyl, ethyl or propyl group. When X represents $CH_2COO$, the acetic acid group should not form a salt with an alkaline substance having a metal such as NaOH or $K_2CO_3$. When X represents $(CH_2CH_2O)_n$, the fluoroalkylsulfonamide compound is derived from ethylene oxide by polycondensation.

The ammonia water used for dissolving the fluoroalkylsulfonamide to prepare the composition of the present invention preferably has as high a concentration as possible. Ammonia water having a concentration higher than 15% by weight is preferred for use in the present invention. In the present invention, the use of an ammonia water having a concentration of about 26–29% by weight at room temperature is most preferred.

The aqueous ammonia composition of the present invention having a low surface tension is readily prepared by dissolving the fluoroalkylsulfonamide compound in ammonia water. In this case, the proportion of the fluoroalkylsulfonamide compound is 0.001–0.3% by weight, and is preferably 0.005–0.2% by weight based on ammonia water. If the proportion of the fluoroalkylsulfonamide compound is less than 0.001% by weight, the resultant composition fails to give an advantageous effect. On the other hand, if the proportion exceeds 0.3% by weight, no additional effect can be obtained, so 0.3% is set as the upper limit of the range for economical reasons.

The aqueous ammonia composition of the present invention is stable during storage at ambient temperatures for extended periods of time, and has a surface tension of about a third of that of ammonia water. Accordingly, the composition according to the present invention exhibits a smaller contact angle against the silicon substrate, so that the composition can easily permeate into the fine structure of the patterns. Further, the composition of the present invention is found to possess a high rate of removal of microparticles from the surface or fine grooves in the pattern of the semiconductor substrate.

Conventional ammonia water exhibits a contact angle against silicon substrate that is relatively large so that wettability of the substrate with ammonia water is far inferior as compared to the wettability of the substrate with the composition of the present invention. Although one may naturally think that the addition of a surfactant to ammonia water as a cleaning agent improves wettability of the substrate with the ammonia water. It has been found that addition of any other conventional surfactant to ammonia water is far more unsuitable for improving the cleaning characteristics of ammonia water than the above specific fluoroalkylsulfonamide compound in the present invention as a component of the cleaning agent for a semiconductor substrate. In view of its excellent stability and outstanding efficacy in removing microparticles from the fine structure of patterns on the substrate, the improvement in the cleaning characteristics of the cleaning agent for semiconductor substrates is quite unexpected.

A small amount of various auxiliary substances may be incorporated into the aqueous ammonia composition of the present invention in an amount that does not destroy the stability of the composition or deteriorate the cleaning performance of the composition. Such auxiliary substances include a water-miscible organic solvent capable of promoting cleaning effect, such as dioxane, and a dye for coloring the composition to distinguish it from other aqueous agent such as ammonia water, etc.

The aqueous ammonia composition of the present invention may be prepared just prior to cleaning the semiconductor substrate or may be previously prepared and stored.

In using the aqueous ammonia composition of the present invention for cleaning a semiconductor substrate, the composition is normally mixed with an aqueous solution of hydrogen peroxide and water. An aqueous solution of hydrogen peroxide used for this purpose preferably has a high concentration of at least 15% by weight. The use of 25–35% by weight of hydrogen peroxide is preferred in the present invention. When a high concentration of the aqueous ammonia composition is used, the use of an equal amount of an aqueous hydrogen peroxide solution having a high concentration is preferred.

Further, an appropriate amount of water is also used for preparing a cleaning agent from the aqueous ammonia composition. The use of water is preferred for maintaining stability of the cleaning agent at ambient temperatures. The amount of water is normally greater than the total amount of the aqueous ammonia composition and the aqueous hydrogen peroxide solution and is determined according to the cleaning purpose.

The present invention will be illustrated in more detail by way of Examples and Comparative Examples.

EXAMPLE 1

Surface tension

As a surfactant of the fluorine series, the following two fluoroalkylsulfonamide compounds of the general formula (I) are used:

Compound A: [in the formula (I), $R^1$ represents $C_8H_{17}$, $R^2$ represents $C_3H_7$, and X represents $(CH_2CH_2O)$]

Compound B: [in the formula (I), $R^1$ represents $C_8F_{17}$, $R^2$ represents $C_3H_7$, and X represents $CH_2COO$], 5 kg of 29% by weight of ammonia water is incorporated with 1.5 g of the above Compound A or B, and the two mixtures are stirred to prepare two aqueous ammonia compositions containing the above Compounds A and B, respectively. Each composition is then mixed with a 30% by weight aqueous solution of hydrogen peroxide and water in a mixing ratio of 1:1:5 to prepare a cleaning agent (solution). The surface tension of each of the cleaning solutions is measured at 20° C. according to the Wilhelmy method. For the purpose of comparison, ammonia water not having the fluoroalkylsulfonamide compound is also subjected to the measurement of surface tension. The results of the measurements are shown in Table 1 below.

TABLE 1

| Surfactant of fluorine series | Surface tension(dyn/cm) |
| --- | --- |
| None (control) | 63.0 |
| Compound A | 20.4 |
| Compound B | 16.4 |

EXAMPLE 2

Contact angle

Using an aqueous ammonia composition containing Compound A, which is prepared in the same manner as described in Example 1, the contact angle against bare silicon wafers is measured according to a usual manner by using a conventional protractor. Another measurement is carried out by using only ammonia water without the fluoroalkylsulfonamide compound A for comparison. The result of the measurement is shown in Table 2 below.

TABLE 2

| Compound A (% by weight) | Contact angle (°) |
| --- | --- |
| 0 (control) | 47.5 |
| 0.01 | 27.5 |
| 0.02 | 13.5 |

EXAMPLE 3

Effect of removing microparticles (1) <Dust in the air>

Bare silicon wafers (4 inch φ) are exposed to air to allow dust to attach thereto. 5 kg of 29% by weight ammonia water is incorporated with 1.5 g of each of the two fluoroalkyl-sulfonamide compounds (the above Compounds A and B) to prepare two aqueous ammonia compositions, respectively. Each composition is then mixed with 30% by weight aqueous hydrogen peroxide and water in a mixing ratio of 1:1:6 in terms of volumetric ratio to prepare a cleaning solution. Using each cleaning solution, the dust in the above wafers is removed under such condition that the wafers are dipped in the cleaning solution for 10 minutes at 25° C., rinsed with water for 5 minutes, spin-dried for 30 seconds at 3000 r.p.m. and checked for the number of microparticles of dust remaining on the wafers using a surface-examination device (Surfscan 4500). For the purpose of comparison, a similar test is performed using ammonia water alone under the same condition as above. The result of the test is shown in Table 3 below.

TABLE 3

| Surfactant of fluorine series | Number of Microparticles ($\geq 0.24$ μm/wafer) | | |
| --- | --- | --- | --- |
| | Before rinsing | After rinsing | Rate of removal |
| None (control) | 15729 | 1576 | 89.9% |
| Compound A | 24648 | 343 | 98.6% |
| Compound B | 24615 | 835 | 96.6% |

EXAMPLE 4

Effect of removing microparticles (2) <Polystyrene latex (1)>

Bare silicon wafers (4 inch φ) are dipped in a diluted hydrofluoric acid having dispersed therein polystyrene latex (a trade name "STADEX" manufactured by Japan Synthetic Rubber Co., Ltd.; particle size: 0.309 μm) whereby the polystyrene microparticles are attached to the surface of the wafers. 5 kg of 29% by weight of ammonia water is incorporated with 1.5 g of each of the two fluoroalkylsulfonamide compounds (the above Compounds A and B) to prepare two aqueous ammonia compositions. Each of the aqueous ammonia compositions is mixed with a 30% by weight aqueous hydrogen peroxide and water in a mixing ratio of 1:1:6 in terms of a volumetric ratio to prepare two cleaning solutions. Using each of the cleaning solutions, removal of the polystyrene microparticles from the surface of the wafer is carried out under such condition that the wafer is dipped in the cleaning solution for 10 minutes at 50° C., rinsed with water for 5 minutes, spin-dried for 30 seconds at 3000 r.p.m. and then checked for the number of polystyrene microparticles remaining on the silicon wafer using a surface-examination device (Surfscan 4500). A similar test is performed using ammonia water alone under the same condition as above. A result of the tests is shown in Table 4 below.

TABLE 4

| Surfactant of fluorine series | Number of Microparticles ($\geq 0.24$ μm/wafer) | | |
| --- | --- | --- | --- |
| | Before rinsing | After rinsing | Rate of removal |
| None (control) | 2644 | 431 | 83.7% |
| Compound A | 2428 | 75 | 96.9% |
| Compound B | 2075 | 49 | 97.6% |

EXAMPLE 5

Effect of removing microparticles (3) <Polystyrene latex (2)>

In the same manner as in Example 4, a bare silicon wafer (4 inch φ) is dipped in a diluted hydrofluoric acid having dispersed thereinto polystyrene latex (STADEX, particle size: 0.309 μm) to attach the particles of polystyrene onto the surface of the wafer. 5 kg of 29% by weight of ammonia water is incorporated with 5 g of a fluoroalkylsulfonamide compound (the above Compound A) to prepare an aqueous ammonia composition. Next, this composition is mixed with a 30% by weight aqueous hydrogen peroxide solution and water in a mixing ratio of 1:1:6 by volume to prepare a cleaning solution. Using this cleaning solution, the silicon wafer is washed under such condition that the wafer is dipped for 10 minutes at 50° C., rinsed with water for 5 minutes and checked for the number of polystyrene microparticles remaining on the wafer using the above Surfscan 4500. For the purpose of comparison, a similar test is performed using ammonia water alone. The result of the tests is shown in Table 5 below.

TABLE 5

| Surfactant of fluorine series | Number of Microparticles ($\geq 0.24$ μm/wafer) | | |
| --- | --- | --- | --- |
| | Before rinsing | After rinsing | Rate of removal |
| None (control) | 10789 | 1652 | 84.7% |
| Compound A | 18432 | 160 | 99.1% |

EXAMPLE 6

Effect of removing microparticles (4) <Polystyrene latex (3)>

The test as described in Example 5 is repeated except that 5 kg of ammonia water is incorporated with 1.5 g of Compound A. The resultant ammonia composition is mixed with a 30% by weight aqueous hydrogen peroxide solution and water in a mixing ratio of 0.1:1:6 by volume to prepare a cleaning solution, and is tested under the following condition: 10 minutes in the dipping treatment at 70° C.; and 5 minutes in the rinsing treatment. Then, the treated silicon wafer is checked for the number of polystyrene microparticles remaining on the wafer using the above Surfscan 4500. For comparison, another test is carried out using the ammonia water alone under the same testing condition. The result of the tests is shown in Table 6 below.

TABLE 6

| Surfactant of fluorine series | Number of Microparticles (≧0.24 μm/wafer) | | |
|---|---|---|---|
| | Before rinsing | After rinsing | Rate of removal |
| None (control) | 11811 | 1843 | 84.4% |
| Compound A | 11414 | 98 | 99.3% |

EXAMPLE 7

Surface-protecting effect

In 5 kg of 29% by weight of ammonia water is dissolved 1.5 g of a fluoroalkylsulfonamide compound (the above Compound A) to prepare an aqueous ammonia composition. This composition is mixed with a 30% by weight aqueous solution of hydrogen peroxide and water in a mixing ratio of 1:1:6 by volume to prepare a cleaning solution. Using this cleaning solution, the same bare silicon wafer as used in Example 6 is repeatedly washed under such treatment condition that the dipping treatment is carried out for 12 hours at 20° C. and the rinsing treatment is carried out repeatedly for 5 minutes. An examination of the surface of the wafer is then made using the same Surfscan 4500 as above to check the defect of the surface in terms of the number of pits. For comparison, the same test is performed using ammonia water alone under the same testing condition. The result of the test is shown in Table 7 below.

TABLE 7

| Surfactant of fluorine series | Repeated times of washing | |
|---|---|---|
| | 1 (once) | 2 (twice) |
| None (control) | 51 | 217 |
| Compound A | 8 | 16 |

As is evident from the above Examples and Comparative Examples, the aqueous ammonia composition of the present invention exhibits an effect on lowering the surface tension of ammonia water, as well as exhibiting outstanding stability, for example, in long-term storage, an outstanding effect in removing microparticles of foreign materials and excellent surface-protecting effect on a semiconductor substrate. Such effects are not achievable with conventional cleaning agent using ammonia water alone.

Accordingly, the technical effects achieved by using the specific surfactant for ammonia water according to the present invention are excellent and beneficially applicable to the manufacture of high density integrated circuits. The preceding representative embodiment may be varied and modified within the scope of the present specification as to the ingredients and the treatment conditions, to achieve essentially the same effect.

As many different embodiments of the invention may be made without departing from the spirit and scope thereof, is to be construed that the present invention is not limited to the specific embodiments thereof illustrated in the Examples, except as defined in the appended claims.

What is claimed is:

1. A cleaning agent for a semiconductor substrate consisting essentially of:

ammonia water having a concentration of ammonia of at least 15% by weight;

0.001 to 0.3% by weight based on ammonia water of a fluoroalkylsulfonamide compound having the following formula:

$$R^1-SO_2NR^2-X-H \qquad (I)$$

wherein $R^1$ represents a fluoroalkyl group having one or more fluorine atoms and the alkyl moiety is a linear or branched alkyl group having 1–18 carbon atoms; $R^2$ represents a hydrogen atom or a lower alkyl group having 1 to 4 carbon atoms, and X represents a $CH_2COO$ or $(CH_2CH_2O)n$ grouping and when X represents a $CH_2COO$ grouping, the acetic group does not form a salt with an alkaline substance having potassium, wherein n is a positive integer from 1 to 20;

a 15–35% by weight aqueous hydrogen peroxide solution; and water.

2. A cleaning agent according to claim 1, wherein the amount of ammonia water is substantially equal to the amount of the aqueous hydrogen peroxide solution.

3. The composition according to claim 1, wherein X is $CH_2COO$.

4. The composition according to claim 1, wherein X is $(CH_2CH_2O)_n$, wherein n is a positive integer from 1 to 20.

5. The composition according to claim 1, further comprising a water-miscible organic solvent.

6. The composition according to claim 1, further comprising a dye for coloring the composition.

7. The cleaning agent according to claim 1, wherein the aqueous hydrogen peroxide has a concentration of 25 to 35% by weight.

\* \* \* \* \*